United States Patent
D'Abreu

(10) Patent No.: US 8,988,946 B1
(45) Date of Patent: Mar. 24, 2015

(54) SELECTIVE SENSE AMPLIFIER ENABLEMENT

(71) Applicant: Sandisk Technologies Inc., Plano, TX (US)

(72) Inventor: Manuel Antonio D'Abreu, El Dorado Hills, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 14/325,065

(22) Filed: Jul. 7, 2014

(51) Int. Cl.
  G11C 11/34 (2006.01)
  G11C 16/04 (2006.01)
  G11C 16/28 (2006.01)
  G11C 13/00 (2006.01)

(52) U.S. Cl.
  CPC ............ G11C 16/28 (2013.01); G11C 13/004 (2013.01)
  USPC ............ 365/185.21; 365/185.08; 365/185.23

(58) Field of Classification Search
  CPC ........... G11C 16/0483; G11C 11/5642; G11C 11/5628; G11C 2211/5634; G11C 11/5621; G11C 29/021
  USPC ............ 365/185.21, 185.23, 185.08, 185.18, 365/185.11, 185.27, 205, 207
  See application file for complete search history.

(56) References Cited

U.S. PATENT DOCUMENTS

| | | | |
|---|---|---|---|
| 7,212,440 B2 | 5/2007 | Gorobets | |
| 7,990,758 B2 | 8/2011 | Mueller | |
| 8,433,980 B2 | 4/2013 | Alrod et al. | |
| 8,472,259 B2 * | 6/2013 | Futatsuyama et al. | ... 365/185.22 |
| 8,780,635 B2 * | 7/2014 | Li et al. | ..................... 365/185.17 |
| 2011/0157978 A1 * | 6/2011 | Shinozaki et al. | ........ 365/185.02 |
| 2014/0010021 A1 * | 1/2014 | Lee et al. | ................. 365/185.18 |
| 2014/0036590 A1 | 2/2014 | Feeley et al. | |
| 2014/0063938 A1 | 3/2014 | Oh et al. | |

* cited by examiner

*Primary Examiner* — Hien Nguyen
(74) *Attorney, Agent, or Firm* — Toler Law Group, PC

(57) ABSTRACT

A method includes, in a data storage device, receiving a read command to read a portion of a wordline of a memory. The method also includes determining a first and a last storage element of the wordline to identify a set of storage elements. The method includes determining a first set and a second set of sense amplifiers of multiple sense amplifiers coupled to the wordline. The first set of sense amplifiers is coupled to the set of storage elements and the second set of sense amplifiers is coupled to one or more storage elements of the wordline other than the first set of storage elements. The method includes reading data by applying a read voltage to the wordline and providing a sense enable signal to each sense amplifier of the first set of sense amplifiers while each sense amplifier of the second set of sense amplifiers is disabled.

24 Claims, 7 Drawing Sheets

SELECTIVE SENSE AMPLIFIER ENABLEMENT

FIELD OF THE DISCLOSURE

The present disclosure is generally related to selectively enabling sense amplifiers.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

As the capacity of non-volatile data storage devices increases (e.g., as a density of storage elements of the memory grows) so does a number of storage elements included in a wordline of the memory. As the number of storage elements included in the wordline increases, so does a number of sense amplifiers coupled to the wordline to enable data to be read from the wordline. Prior to a read operation performed on the wordline, a voltage is applied to each sense amplifier coupled to the wordline and each of the sense amplifiers achieves a steady state operating condition. Accordingly, as the capacity increases, performing a read operation to read data stored at the wordline involves a power intensive process to provide voltage to all of the sense amplifiers coupled to the wordline.

SUMMARY

A data storage device includes a controller and a memory coupled to the controller. The data storage device includes a decoder configured to receive a read request associated with a read operation to read a portion of a wordline of the memory. Based on the read request, the decoder may identify a set of storage elements that correspond to the portion of the wordline to be read. For example, the read request may include an address and an amount of data to be read and, based on the read request, the decoder may identify a first storage element and a last storage element of the wordline to be read. After identifying the set of storage elements to be read, the decoder may selectively enable a set of sense amplifiers that correspond to the set of storage elements to be read and selectively disable one or more sense amplifiers that do not correspond to the set of storage elements to be read. For example, the decoder may generate a bitmask that is applied to selectively enable/disable a plurality of sense amplifiers coupled to the wordline. Accordingly, when the set of sense amplifiers is enabled (and the one or more sense amplifiers are disabled) the set of storage elements (e.g., the portion of the wordline) may be read from the memory.

The decoder may selectively enable a first set of sense amplifiers and selectively disable a second set of sense amplifiers based on identification of the portion of the wordline to be read. As a result, an amount of power used to power the plurality of sense amplifiers during a read operation may be reduced as compared to a data storage device that does not selectively disable one or more sense amplifiers. Additionally, by selectively enabling less than all of the sense amplifiers coupled to the wordline, an amount of time to perform a read operation of the wordline may be reduced as compared to a read operation of the wordline where all of the sense amplifiers coupled to the wordline are enabled.

DETAILED DESCRIPTION

Particular embodiments of the present disclosure are described with reference to the drawings. In the description, common features are designated by common reference numbers throughout the drawings.

Figure 1:
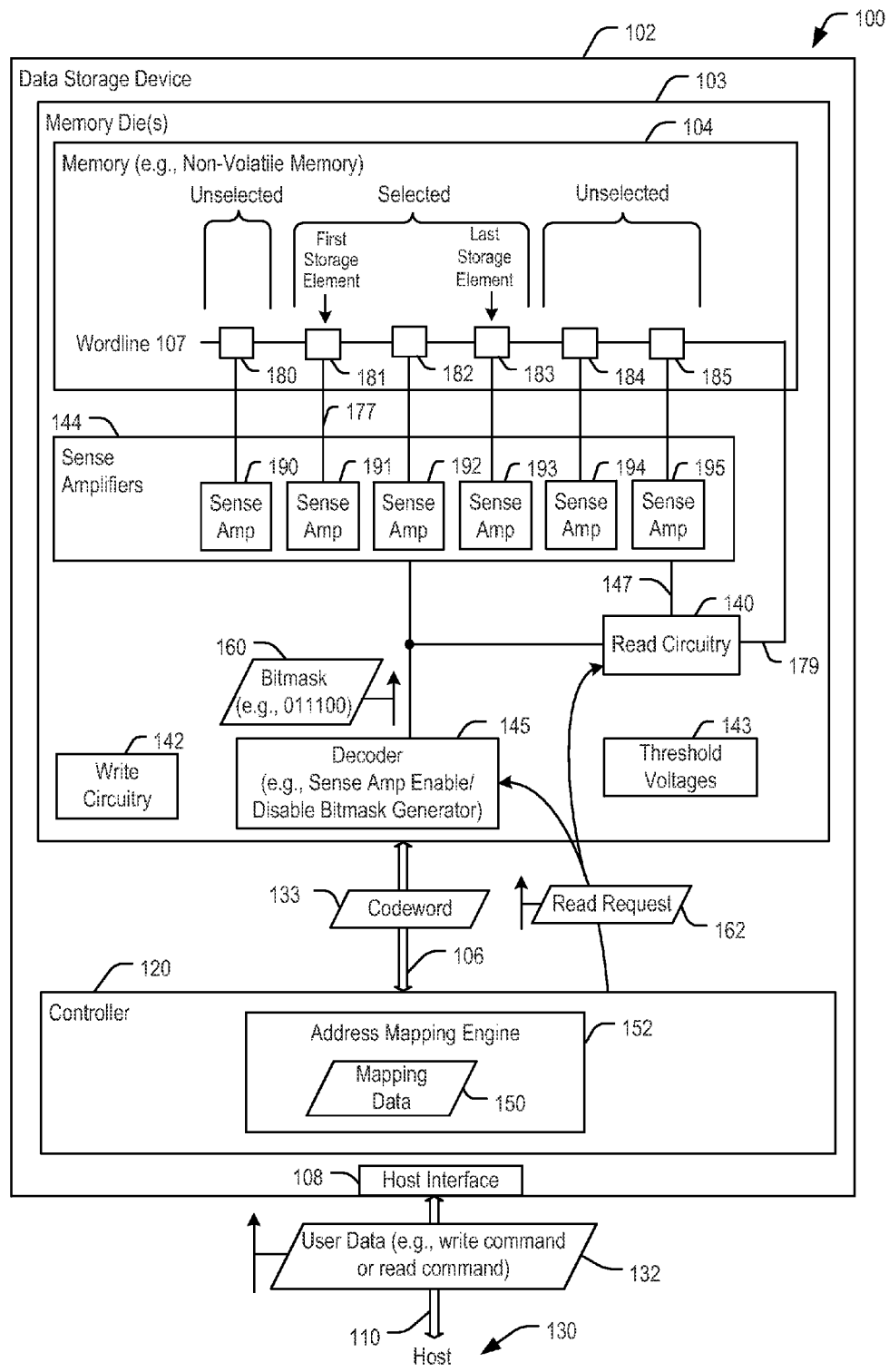
FIG. 1 is a block diagram of a particular illustrative embodiment of a system including a data storage device including sense amplifiers that are configured to be selectively enabled/disabled.

FIG. 1 is a block diagram of a particular illustrative embodiment of a system 100 including a data storage device 102 and a host device 130. The data storage device 102 includes a controller 120 (e.g., a memory controller) coupled to a memory device including one or more memory dies, such as a representative memory die 103. The memory die 103 may include a memory 104 (e.g., a non-volatile memory, such as a flash memory). The memory 104 may include sense amplifiers 144 that may be selectively configured (e.g., enabled and/or disabled) to reduce an amount of power consumed during a read operation of a wordline, such as a representative wordline 107, of the memory 104. For example, a decoder 145 may be configured to determine a portion of the wordline 107 to be read and to selectively enable a set of sense amplifiers that correspond to the portion and to selectively disable one or more sense amplifiers that do not correspond to the portion, as described further herein. To illustrate, the decoder 145 may be configured to generate a bitmask that, when applied to the sense amplifiers 144, causes a first set of sense amplifiers (coupled to the wordline 107) to be enabled and causes a second set of sense amplifiers (coupled to the wordline 107) to be disabled.

The data storage device 102 may be embedded within the host device 130, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 130. For example, the data storage device 102 may be removably coupled to the host device 130 in accordance with a removable universal serial bus (USB) configuration. In some embodiments, the data storage device 102 may include or correspond to a solid state drive (SSD), which may be used as an embedded storage drive, an enterprise storage drive (ESD), or a cloud storage drive (CSD), as illustrative, non-limiting examples.

The data storage device 102 may be configured to be coupled to the host device 130 via a communication path 110, such as a wired communication path and/or a wireless communication path. For example, the data storage device 102 may include an interface 108 (e.g., a host interface) that enables communication (via the communication path 110) between the data storage device 102 and the host device 130, such as when the interface 108 is coupled to the host device 130.

For example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The host device 130 may include a processor and a memory. The memory may be configured to store data and/or instructions that may be executable by the processor. The memory may be a single memory or may include one or more memories, such as one or more non-volatile memories, one or more volatile memories, or a combination thereof. The host device 130 may issue one or more commands to the data storage device 102, such as one or more requests to read data from or write data to the memory 104 of the data storage device 102. For example, the host device 130 may be configured to provide data, such as user data 132, to be stored at the memory 104 or to request data to be read from the memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory interface that enables reading from the memory 104 and writing to the memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the memory 104 in accordance with any other suitable communication protocol.

The data storage device 102 includes a controller 120 coupled to the memory die 103. The controller 120 may be coupled to the memory die 103 via a bus 106, an interface (e.g., interface circuitry), another structure, or a combination thereof. The memory die 103 may be separate from the controller 120 and coupled to the controller 120 (e.g., via the bus 106). For example, the controller 120 may be included in a particular die that is distinct from the memory die 103. However, in other implementations, the memory die 103 may include the controller 120.

The controller 120 is configured to receive data and instructions from and to send data to the host device 130 while the data storage device 102 is operatively coupled to the host device 130. The controller 120 is further configured to send data and commands to the memory 104 and to receive data from the memory 104. For example, the controller 120 is configured to send data and a write command to instruct the memory 104 to store the data to a specified address. The controller 120 may be configured to send a read request 162 to the memory 104 to read data from a specified address of the memory 104.

The controller 120 may include an address mapping engine 152. The address mapping engine 152 may be configured to use mapping data 150, such as logical-to-physical address mapping data, to map a logical address to a physical address and/or to map a physical address to a logical address. For example, the address mapping engine 152 may map a particular logical address included in a read request or a write request received from the host device 130 to a physical address of the memory 104. The mapping data 150 may be stored at the memory 104 and retrieved for use by the controller 120. The controller 120 may store the mapping data 150 at a memory (not shown) of the controller 120, such as at a random access memory (RAM). Although the address mapping engine 152 is illustrated as being included in the controller 120, in other embodiments, the address mapping engine 152 may be included in the memory die 103.

The memory 104 may include a non-volatile memory (e.g., a NAND flash memory). The memory 104 may include a two dimensional (2D) memory configuration or a three dimensional (3D) memory configuration. To illustrate, a plurality of storage elements of the memory 104 may be arranged in a 2D configuration or a 3D configuration. Examples of resistive random access memory (ReRAM) and 3D NAND architectures are described with reference to FIGS. 6 and 7, respectively. The memory 104 may include a group of storage elements, such as the representative storage elements 180-185. The group of storage elements may be arranged in one or more pages, one or more wordlines (e.g., a representative wordline 107 that includes the storage elements 180-185), and/or one or more blocks. For example, each of the wordlines may include one or more pages (e.g., physical pages). Additionally, each of the multiple word lines may be included in a block of the memory 104. Each storage element of the group of storage elements may be configured as a single-level cell (SLC) or a multi-level cell (MLC) cell. The memory 104 may store data, such as the user data 132 or encoded user data, such as a codeword 133, as described further herein. Although the wordline 107 is illustrated as including six storage elements, in other embodiments the wordline 107 may include fewer than six storage elements or more than six storage elements.

The memory 104 may include support circuitry associated with each operation of the memory 104. For example, the memory 104 may be associated with circuitry to support operation of the storage elements 180-185, such as sense amplifiers 144, read circuitry 140, write circuitry 142, and a decoder 145. The memory 104 may also be associated with one or more threshold voltages 143 that are used to determine one or more bit values stored at the storage elements 180-185. Although depicted as separate components, the sense amplifiers 144, the read circuitry 140, the write circuitry 142, and the decoder 145, or a combination thereof, may be combined into a single component (e.g., hardware and/or software) of the memory 104 (e.g., the memory die 103).

The read circuitry 140 and the write circuitry 142 may be configured to enable operations of reading data from the memory 104 and writing data to the memory 104, respectively. For example, the write circuitry 142 may be configured to write data to the memory 104 and the read circuitry 140 may be configured to read the data from the memory 104. Although illustrated as separate components, the read circuitry 140 and the write circuitry 142 may be included in a single component of the memory die 103.

To read data from the memory 104 (e.g., from the wordline 107), the read circuitry 140 may be configured to apply a reading voltage to the wordline 107 via a conductive path 179. For example, the read circuitry 140 may activate a wordline driver to apply the reading voltage to the wordline via the conductive path 179. Additionally, the read circuitry 140 may activate bit line drivers coupled to bit lines corresponding to the storage elements 180-185. The bit line drivers may apply a bit line read voltage to each of the bit lines to enable a read current to flow through each of the storage elements. Each bit line may be coupled to a corresponding sense amplifier (of the sense amplifiers 144) that receives the current in the bit line and converts the current to a voltage value that is provided to the read circuitry 140 via a path 147. The read circuitry 140 may be configured to compare voltage values from the sense amplifiers 144 to one or more of the threshold voltages 143 to determine bit values associated with the storage elements 180-185.

The sense amplifiers 144 may be coupled to the storage elements 180-185 of the wordline 107. The sense amplifiers 144 may include a plurality of sense amplifiers 190-195. Although the sense amplifiers 144 are illustrated as including six sense amplifiers, in other embodiments the sense amplifiers 144 may include fewer than six sense amplifiers or more than six sense amplifiers. Each sense amplifier of the plurality of sense amplifiers 190-195 may correspond to a different storage element of the storage elements 180-185 of the wordline 107. Each sense amplifier of the plurality of sense amplifiers 190-195 may be individually enabled and/or disabled independent of an enable/disable state of any other of the sense amplifiers 190-195. For example, the plurality of sense amplifiers 190-195 may be enabled/disabled based on the bitmask 160 provided by the decoder 145 that includes a separate bit for each of the sense amplifiers 190-195 indicating whether the sense amplifier corresponding to the bit is enabled or disabled. When a particular sense amplifier is enabled, the particular sense amplifier may receive a bit line current (via a bit line) flowing through a particular corresponding storage element. To illustrate, when the sense amplifier 191 is enabled, the sense amplifier may receive a bit line current (via a representative bit line 177) flowing through a particular storage element 181 and may be powered so that circuit elements, such as a switch, in the sense amplifier 191 enable operation of the sense amplifier 191.

The decoder 145 may be configured to determine which of the plurality of sense amplifiers 190-195 to enable/disable based on a read request, such as the read request 162 to read a portion of the wordline 107. For example, the decoder 145 may be configured to receive the read request 162 that includes a logical address or a logical address range to be read, a physical address or a physical address range to be read, an amount of data to be read, or a combination thereof. Based on the read request, the decoder 145 may identify a physical address of the memory 104 corresponding to the portion of the wordline 107 to be read. The decoder 145 may determine a first storage element of the wordline 107 to be read and a last storage element of the wordline 107 to be read to identify a first set of storage elements of the wordline 107. To illustrate, based on the physical address and an amount of data to be read, the decoder 145 may determine the storage element 181 is the first storage element and may determine that the storage element 183 is the last storage element. Accordingly, the first set of storage elements may include the storage elements 181-183.

The decoder 145 may also be configured, after identifying the first set of storage elements to be read, to determine a first set of sense amplifiers to be enabled (e.g., selected), a second set of sense amplifiers to be disabled (e.g., unselected), or a combination thereof. For example, when the first set of storage elements includes the storage elements 183, the first set of sense amplifiers to be selectively enabled may include the sense amplifiers 191-193 and the second set of sense amplifiers to be selectively disabled may include the sense amplifiers 190 and 194-195.

The decoder 145 may be configured to generate a bitmask 160 to enable the first set of sense amplifiers and to disable the second set of sense amplifiers. For example, a bit value of '0' may disable a corresponding sense amplifier and a bit value of 1' may enable a corresponding sense amplifier. To illustrate, when the bitmask 160 has a value of "011100" the sense amplifier 190 may be disabled, the sense amplifiers 191-193 may be enabled, and the sense amplifiers 194-195 may be disabled. The decoder 145 may provide the bitmask 160 to the sense amplifiers 144 and/or to the read circuitry 140.

During operation, the data storage device 102 may be coupled to the host device 130. The data storage device 102 may receive a read command, such as the user data 132, from the host device 130. The user data 132 may include a logical address or a range of logical addresses to be read, an amount of data to be read, or a combination thereof. The read command may instruct the data storage device 102 to read a portion of the wordline 107 of the memory 014.

The controller 120 may receive the read command. The address mapping engine 152 may translate the logical address or the logical address range included in the read command to a physical address or a physical address range based on the mapping data 150. The controller may generate the read request 162 that includes the logical address or the logical address range to be read, the physical address or the physical address range to be read, the amount of data to be read, or a combination thereof. The read request 162 may instruct the read circuitry 140 to read the portion of the wordline 107, such as one or more codewords of a plurality of codewords stored at the memory 104. The controller 120 may send the read request 162 to the decoder 145 and/or to the read circuitry 140.

The decoder 145 may receive the read request 162 and signal the sense amplifiers 144 to selectively enable one or more sense amplifiers that correspond to the portion of the wordline 107 to be read and to selectively disable one or more sense amplifiers that do not correspond to the portion of the wordline 107 to be read. For example, the decoder 145 may generate the bitmask 160 that is applied to selectively enable/disable the sense amplifiers 144. The decoder 145 may also signal (e.g., send the bitmask 160 to) the read circuitry 140 to inform the read circuitry 140 which of the sense amplifiers 144 will be enabled during a read operation. Based on the bitmask 160, the read circuitry 140 may be aware of which sense amplifiers are configured to provide output values that may be used to determine bit values stored at the portion of the wordline 107.

The read circuitry 140 may initiate a read operation based on the read request 162. Based on the read operation, the read circuitry 140 may determine read data (e.g., one or more bit values) that correspond to the portion of the wordline 107. The read data may be representative of one or more codewords stored at the portion of the wordline 107. To illustrate, the read data may include a representation of a particular codeword sent to the controller 120 as the codeword 133. The read circuitry 140 may send the read data to an error correction code (ECC) engine to detect and/or correct one or more errors in the read data, such as the codeword 133, prior to sending at least a portion of the read data to the host device 130.

In a particular embodiment, the read circuitry 140 may receive output values associated with each of the sense amplifiers 144 regardless of whether one or more of the sense amplifiers is disabled (e.g., unselected). Output values associated with the disabled sense amplifiers may be undefined and the read circuitry 140 may be configured to extract (e.g., parse) output values associated with the enabled sense amplifiers from among all of the output values received from the sense amplifiers 144, such as by reference to the bitmask 160.

Although the decoder 145 is illustrated in FIG. 1 as being separate from the read circuitry 140, in some embodiments, the decoder 145 and the read circuitry 140 may be included in the same component. Although the decoder 145 is illustrated as being included in the memory die 103, in other embodiments the decoder 145 may be included in the controller 120. For example, the decoder 145 and the address mapping engine 152 may be included in the same component. When the decoder 145 is included in the controller 120, the read request 162 may include the bitmask 160.

The decoder 145 may be configured to determine a physical address based on a logical address associated with a read command to read a portion of the wordline 107, such as a read command received from the host device 130. For example, the decoder 145 may be configured to access the mapping data 150 stored at the controller 120, a copy of the mapping data 150 stored at the memory 104, or a copy of the mapping data 150 stored at another storage device (e.g., another memory) accessible to the decoder 154.

In a particular, the data storage device 102 may include multiple memory dies that include the memory die 103. For example, the multiple memory dies may be stacked in a three-dimensional (3D) configuration. Each of the multiple memory dies may include one or more wordlines and corresponding storage elements. Each memory die of the multiple memory dies may include a corresponding decoder, such as the decoder 145. The decoder of a particular memory die that includes the wordline may determine a set of sense amplifiers that are coupled to a set of storage elements to be read based on a read command (or read request). To illustrate, the decoder 145 of the memory die 103 that includes the wordline 107 may determine a set of sense amplifiers (e.g., sense amplifiers 191-193) that are coupled to a set of storage elements (e.g., the storage elements (181-183) of the memory 104 and that correspond to the portion of the wordline 107 to be read based on the read command from the host device 130 and/or the read request 162.

The mapping data 150 may be stored at the memory 104. Additionally, the mapping data 150 may be stored at a memory (not shown), such as a random access memory, of the controller 120. The memory of the controller 120 may be a single memory component, may include multiple distinct memory components, and/or multiple different types (e.g., volatile memory and/or non-volatile) of memory components. In other implementations, at least a portion of the mapping data 150 may be stored at a memory of the host device 130, at another memory that is coupled to the controller 120, or a combination thereof.

In some embodiments, the data storage device 102 may include an error correction code (ECC) engine. The ECC engine may be configured to receive data, such as the user data 132, and to generate one or more error correction code (ECC) codewords (e.g., including a data portion and a parity portion) based on the data. For example, the ECC engine may receive the user data 132 and may generate a codeword. To illustrate, the ECC engine may include an encoder configured to encode the data using an ECC encoding technique. The ECC engine may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine may include a decoder configured to decode data read from the memory 104 to detect and correct bit errors that may be present in the data. For example, the ECC engine may correct a number of bit errors up to an error correction capability of an ECC technique used by the ECC engine. A number of errors identified by the ECC engine may be tracked by the controller 120, such as by the ECC engine. For example, based on the number of errors, the ECC engine may determine a bit error rate (BER) associated with the memory 104.

The decoder 145 may enable the sense amplifiers 144 to be selectively enabled and/or selectively disabled responsive to identification of the portion of the wordline 107 to be read. As a result, an amount of power used to power the sense amplifiers 144 during a read operation may be reduced as compared to a data storage device that does not selectively disable one or more sense amplifiers. Additionally, by selectively enabling less than all of the sense amplifiers 144 coupled to the wordline 107, an amount of time to perform a read operation of the wordline 107 may be reduced as compared to a read operation of the wordline where all of the sense amplifiers coupled to the wordline are enabled.

Figure 2:
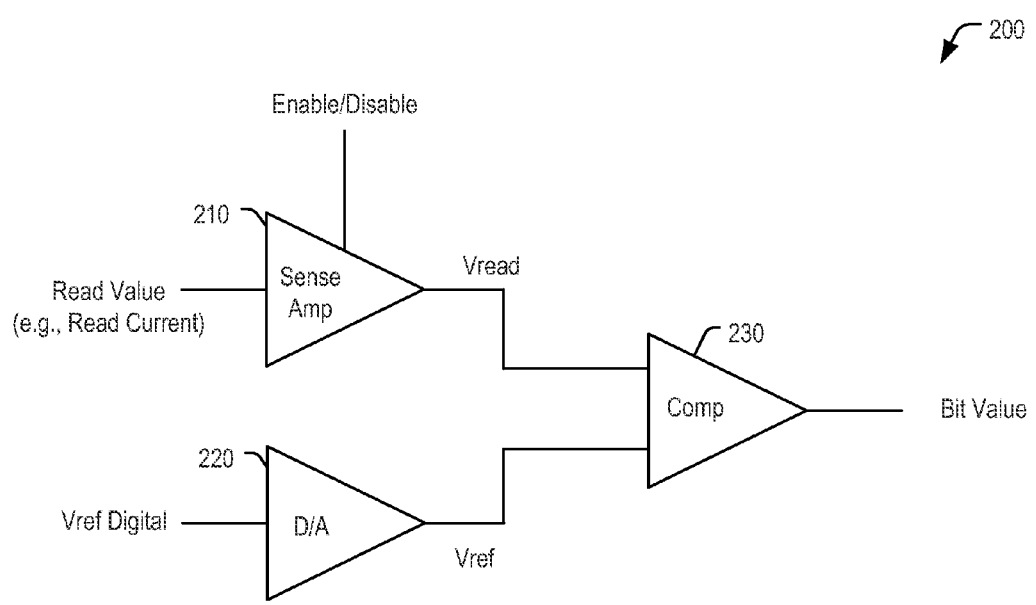
FIG. 2 is a diagram of a circuit including a sense amplifier that is configured to be selectively enabled/disabled.

Referring to FIG. 2, an illustrative circuit including a sense amplifier that is configured to be selectively enabled/disabled is depicted and generally designated 200. The circuit 200 may be included in the memory 104, one or more of the sense amplifiers 190-195, and/or the read circuitry 140 of FIG. 1.

The circuit 200 may include a sense amplifier 210, a digital-to-analog (D/A) converter 220, and a comparator 230. The sense amplifier 210 may include or correspond to one of the sense amplifiers 190-195 of FIG. 1. The sense amplifier 210 may be coupled to one or more corresponding storage elements of a memory via a bit line. For example, referring to FIG. 1, the sense amplifier 191 is coupled to the storage element 181 via a bit line 177. The sense amplifier 210 may be configured to be selectively enabled or selectively disabled based on an enable/disable signal. For example, the enable/disable signal may correspond to a value of a bit of a bitmask, such as the bitmask 160 of FIG. 1. The sense amplifier 210 may be configured to receive a read value, such as a read current, during a read operation performed on a particular storage element coupled to the sense amplifier 210 via the bit line. An amount of read current received at the sense amplifier 210 may correspond to a data value programmed at the particular storage element. When the sense amplifier 210 is enabled, the sense amplifier 210 may be configured to output a read voltage value (Vread) based on the received read value. An enable signal my control connection of the sense amplifier 210 to a power supply or a ground, may prevent or allow the read value to be received, and/or may prevent or enable the output signal to be generated.

The D/A converter 220 may be configured to receive a digital reference value (VrefDigital). For example, the digital reference value may include or correspond to a particular threshold voltage of the threshold voltages 143. The D/A converter 220 may output a reference voltage value (Vref) based on the received digital reference value (Vref Digital).

The comparator 230 may be coupled to the sense amplifier 210 and to the D/A converter 220. The comparator 230 may be configured to receive the read voltage value (Vread) and the reference voltage value (Vref). The comparator 230 may further be configured to generate an output value associated with a data value stored at the storage element that corresponds to the sense amplifier 210.

Although the D/A converter 220 and the comparator 230 are illustrated as not receiving the enable/disable signal, in other embodiments the D/A converter 220 and/or the comparator 230 may receive the enable/disable signal at respective enable inputs (not shown). Accordingly, the D/A converter 220 and/or the comparator 230 may be selectively enabled or selectively disabled along with the sense amplifier 210. For example, the entire circuit 200 may be configured to be disabled based on the enable/disable signal.

Figure 3:
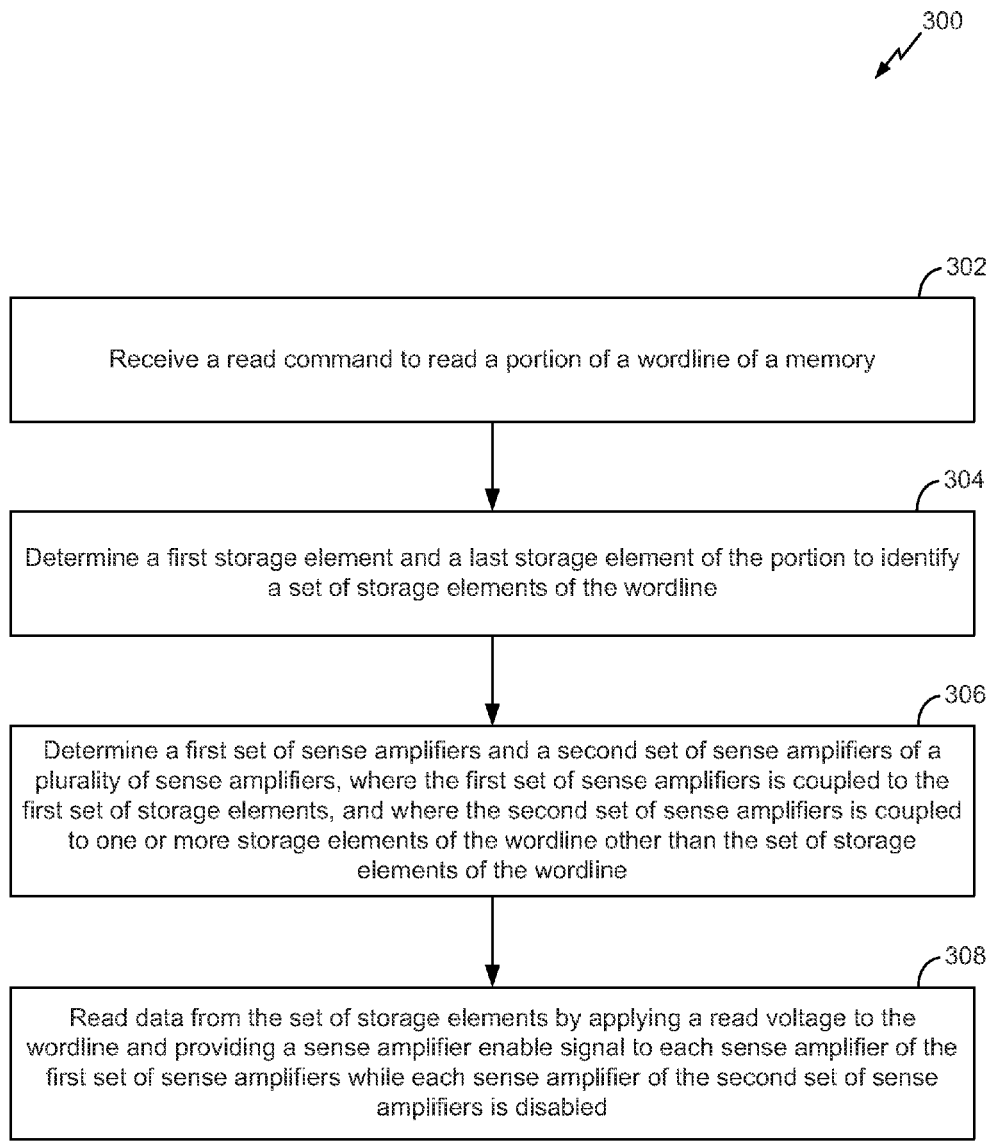
FIG. 3 is a flow diagram of an illustrative embodiment of a method to selectively enable one or more sense amplifiers.

Referring to FIG. 3, an illustrative embodiment of a method 300 to read a portion of a wordline is shown. For example, the method 300 may be performed by the memory 104 (e.g., the decoder 145) or the controller 120 of the data storage device 102 of FIG. 1.

The method 300 includes receiving a read command to read a portion of a wordline of a memory, at 302. The read command may include or be associated with a logical address to be read, a physical address to be read, an amount of data to be read, or a combination thereof. The wordline may be configured to store data corresponding to multiple codewords. The wordline of the memory may include or correspond to the wordline 107 of the memory 104 of FIG. 1.

The method 300 also includes determining a first storage element and a last storage element of the portion to identify a set of storage elements of the wordline, at 304. For example, a decoder, such as the decoder 145 of FIG. 1, may receive the read command and may identify the first storage element and the last storage element. The first storage element and the last storage element may define a range of storage elements that correspond to the portion. The range of storage elements may include or correspond to one or more codewords.

The method 300 may also include determining a first set of sense amplifiers and a second set of sense amplifiers of a plurality of sense amplifiers, at 306. The first set of sense amplifiers may be coupled to the set of storage elements and the second set of sense amplifiers may be coupled to one or more storage elements of the wordline other than the set of storage elements of the wordline. For example, the decoder may identify the set of sense amplifiers and the second set of sense amplifiers based at least in part on the identified set of storage elements. The plurality of sense amplifiers may include or correspond to the sense amplifiers 144 of FIG. 1.

The method 300 also includes reading data from the set of storage elements by applying a read voltage to the wordline and providing a sense amplifier enabling signal to each sense amplifier of the first set of sense amplifiers while each sense amplifier of the second set of sense amplifiers is disabled, at 308. The data stored at the set of storage elements may correspond to a codeword. The sense amplifier enabling signal may be applied to each sense amplifier of the first set of sense amplifiers based on a sense amplifier bit mask generated by the decoder. The sense amplifier bitmask may be configured to enable the first set of sense amplifiers while the second set of sense amplifiers is disabled.

Thus, the plurality of sense amplifiers coupled to the wordline may be configured to enable a first set of sense amplifiers to read the portion of the wordline and to disable the second set of sense amplifiers that do not correspond to the portion of the wordline. By selectively configuring (enabling and/or disabling) the sense amplifiers for use during the read operation, an amount of power consumed by the sense amplifiers may be reduced as compared to when all of the sense amplifiers are used to read an entirety of the wordline.

The method 300 of FIG. 3 may be initiated or controlled by an application-specific integrated circuit (ASIC), a processing unit, such as a central processing unit (CPU), a digital signal processor (DSP), a controller, another hardware device, a firmware device, a field-programmable gate array (FPGA) device, or any combination thereof. As an example, the method 300 of FIG. 3 can be initiated or controlled by one or more processors, such as one or more processors included in or coupled to a controller or a memory. A controller configured to perform the method the method 300 of FIG. 3 may be able to selectively enable/disable sense amplifiers for use during a read operation.

Figure 4:
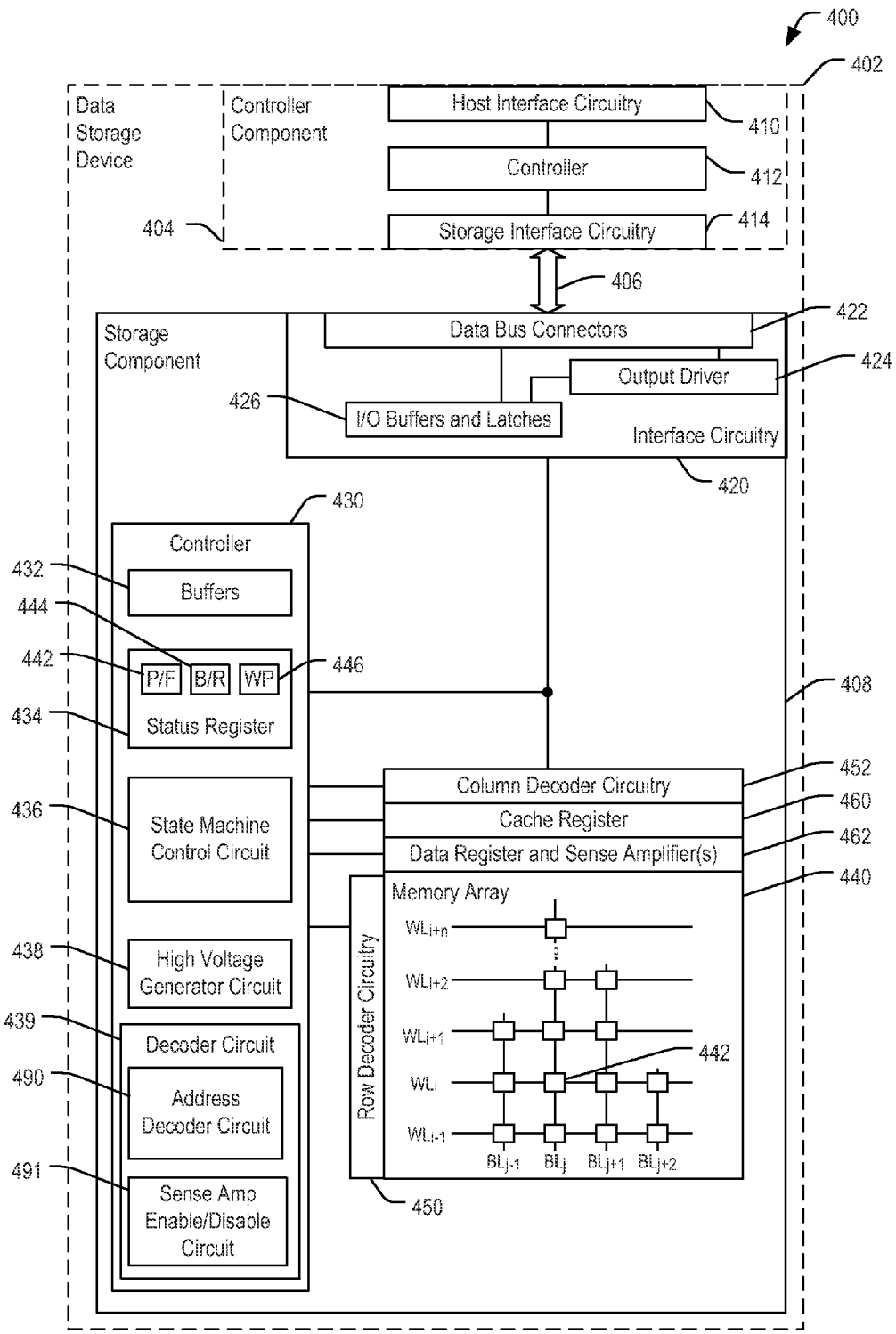
FIG. 4 is a block diagram of another illustrative system configured to selectively enable one or more sense amplifiers.

Referring to FIG. 4, an illustrative embodiment of a system including a data storage device is depicted and generally designated 400. The system 400 includes a data storage device 402 that includes a controller component 404 coupled to a storage component 408. The data storage device 402 may include or correspond to the data storage device 102 of FIG. 1. The storage component 408 may include or correspond to the memory die 103 of FIG. 1.

The controller component 404 may include host interface circuitry 410, a controller 412, and storage interface circuitry 414. For example, the controller component 404 may include or correspond to the controller 120 of FIG. 1. The host interface circuitry 410 may include or correspond to the host interface 108.

The controller component 404 may be coupled to the storage component 408 via a bus 406, such as an 8-bit or 16-bit parallel data bus, as an illustrative, non-limiting example. The bus 406 may include or correspond to the bus 106 of FIG. 1. The controller component 404 may communicate instructions and data with an external host (not shown) via the host interface circuitry 410. The controller 412 may be configured to respond to instructions received by the host interface circuitry 410 and may also be configured to send and receive data and instructions to the storage component 408 via the storage interface circuitry 414.

In a particular embodiment, the storage component 408 includes interface circuitry 420, a controller 430 coupled to the interface circuitry 420, and a memory array 440 accessible to the controller 430. For example, the memory array 440 may include or correspond to the memory 104 of FIG. 1.

The memory array 440 may include multiple wordlines and multiple bit lines. For example, the memory array 440 may include a first wordline $WL_{i-1}$, a second wordline $WL_i$, a third wordline $WL_{i+1}$, a fourth wordline $WL_{i+2}$, and a fifth wordline $WL_{i+n}$. Although the memory array 440 is illustrated as having five wordlines, the memory array 440 may include more than five wordlines or fewer than five wordlines. As another example, the memory array 440 may include a first bit line $BL_{j-1}$, a second bit line $BL_j$, a third bit line $BL_{j+1}$, and a fourth bit line $BL_{j+2}$. Although the memory array 440 is illustrated as having four bit lines, the memory array may include more than four bit lines or fewer than four bit lines.

The storage component 408 may include row decoder circuitry 450 and column decoder circuitry 452 that enable access to data stored at one or more particular rows and particular columns of the memory array 440, such as to read a value from or to write a value to a particular memory cell 442 at a bit line $BL_j$ and at word line $WL_i$. A cache register 460 and a data register and sense amplifier(s) 462 may further be coupled to the memory array 440 and may be used to cache or to temporarily store data that is to be written to the memory array 440 or data that has been read out of the memory array 440. The sense amplifiers, such as the sense amplifiers 144 of FIG. 1 or the sense amplifier 210 of FIG. 2, may be coupled to the bit lines $BL_{j-1}$-$BL_{j+2}$. Each of the sense amplifiers may be configured to be selectively enabled and selectively disabled. In a particular embodiment, the memory array 440 may include a flash memory. In some embodiments, the memory array 440 may include a 3D memory, as described further with reference to FIGS. 6-7.

In a particular embodiment, the controller 430 includes one or more buffers 432 to store instructions, data, or any combination thereof. The controller 430 may also include one or more status registers 434, a state machine control circuit 436, a high voltage generator circuit 438, and a decoder circuit 439. The controller 430 may be coupled to provide electrical signals to the row decoder circuitry 450, to the column decoder circuitry 452, to the cache register 460, and to the data register and sense amplifiers 462. In a particular embodiment, the status register 434 of the controller 430 may include one or more indicators storing values, such as a Pass/Fail (P/F) value 442, a Busy/Ready (B/R) value 444, a write protect (WP) value 446, one or more other indicators, or a combination thereof. The status register 434 may be accessible to the state machine control circuit 436.

The state machine control circuit 436 may include dedicated hardware and circuitry to control an operation of the controller 430 in response to one or more received instructions and internal states, such as may be represented at the status register 434. The state machine control circuit 436 may include states such as a read status state, a data write state, a data read state, as illustrative, non-limiting examples.

In a particular embodiment, the high voltage generator circuit 438 may be responsive to the state machine control circuit 436 and may be configured to generate a high voltage to program values to, or erase values from, the memory array 440. For example, the memory array 440 may be a flash memory or other memory that may be programmable or erasable via a "high" voltage, such as, for example, five volts (V).

The controller 430 may also include the decoder circuit 439. The decoder circuit 439 may include an address decoder circuit 490 and a sense amplifier enable/disable circuit 491. The address decoder circuit 490 may include hardware and logic circuitry to receive memory address information from the controller component 404 and to decode the memory address information to specific rows and columns to be provided to the row decoder circuitry 450 and the column decoder circuitry 452. The sense amplifier enable/disable circuit 491 may include hardware and logic circuitry to receive memory address information from the address decoder circuit 490, to determine a set of storage elements of the memory array 440 that correspond to a portion of a wordline to be read, and/or to send enable/disable signals (e.g., a bitmask, such as the bitmask 160 of FIG. 1) to the data registers and sense amplifiers 462. The sense amplifier enable/disable circuit 491 may include or correspond to the decoder 145 of FIG. 1. Although the sense amplifier enable/disable circuit 491 is illustrated as being included in the controller 430, in other embodiments the sense amplifier enable/disable circuit 491 may be distinct from the controller 430. In some embodiments, the sense amplifier enable/disable circuit 491 may be included in the data register and sense amplifiers 462.

The interface circuitry 420 may include data bus connectors 422, an output driver 424 coupled to the data bus connectors 422, and input/output (I/O) buffers and latches 426. The I/O buffers and latches 426 may be configured to store or to latch data that is received via the data bus connectors 422 or data that is to be written to the data bus 406 via the data bus connectors 422. The data bus connectors 422 may include physical electrical connectors that couple the interface circuitry 420 to the data bus 406. The output driver 424 may include dedicated circuitry and electrical connections to enable the interface circuitry 420 to drive electrical signals over the bus 406. In a particular embodiment, the interface circuitry 420 is configured to comply with one or more bus communications protocols or standards.

Figure 5:
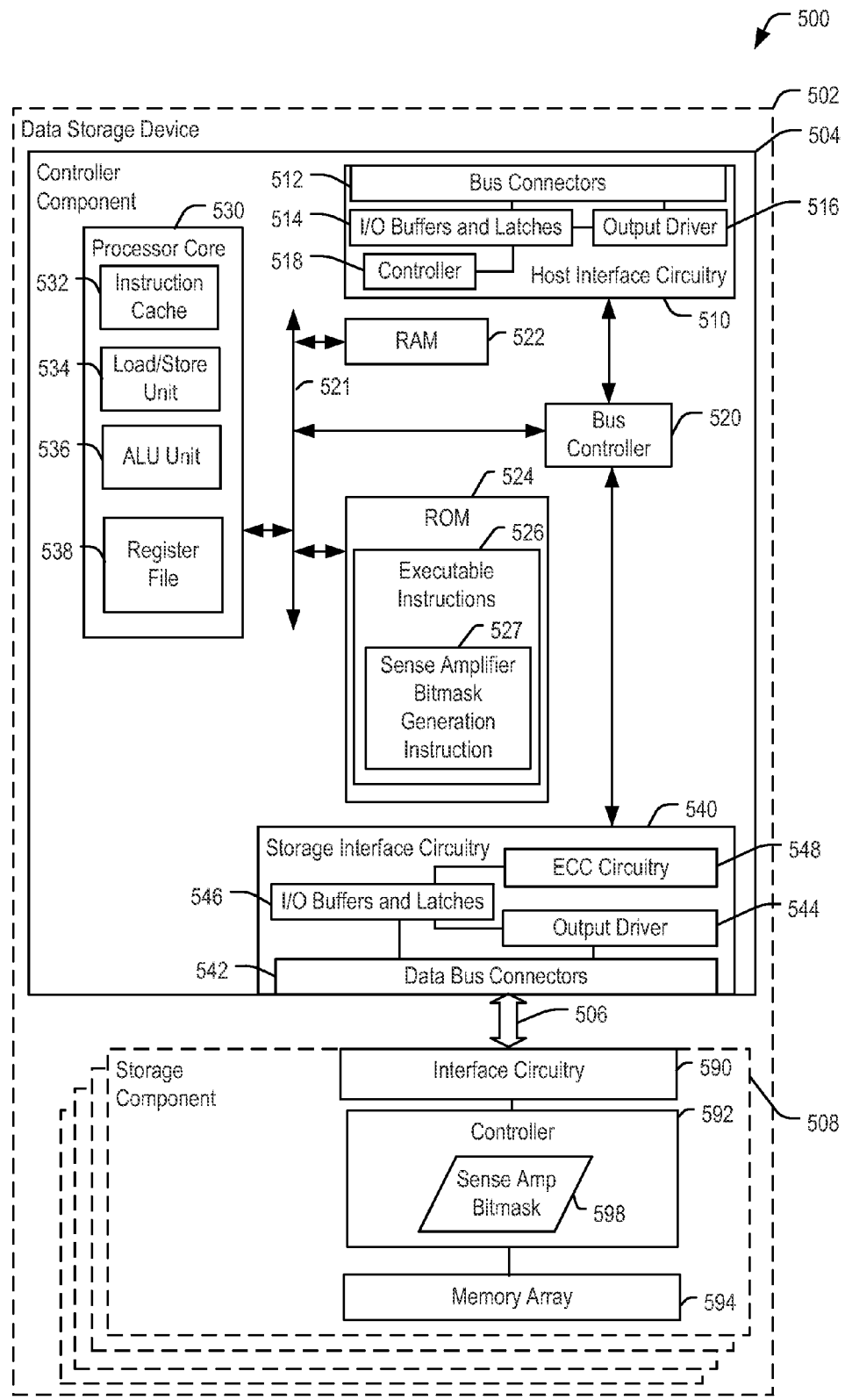
FIG. 5 is a block diagram of another illustrative system configured to selectively enable one or more sense amplifiers.

Referring to FIG. 5, an illustrative embodiment of a system including a data storage device is depicted and generally designated 500. The system 500 includes a data storage device 502 that includes a controller component 504 coupled to one or more storage components, such as a representative storage component 508, via a bus 506. The data storage device 502 may include or correspond to the data storage device 102 of FIG. 1 or the data storage device 402 of FIG. 2. The bus 406 may include or correspond to the bus 106 of FIG. 1 or the bus 406 of FIG. 4. The controller component 404 may include or correspond to the controller 120 of FIG. 1 or the controller component 404 of FIG. 4.

The representative storage component 508 may include or correspond to the memory die 103 of FIG. 1. The representative storage component 508 includes interface circuitry 590 to communicate via the bus 506.

The storage component 508 also includes a controller 592 that is coupled to the interface circuitry 590 and that is also coupled to a memory, such as a memory array 594. The controller 592 may be configured to receive a sense amplifier bitmask 598, such as the bitmask 160 of FIG. 1. The sense amplifier bitmask 598 may be applied to selectively enable and/or disable sense amplifiers coupled to or included in the memory array 594. For example, the sense amplifiers may be selectively enabled and/or selectively disabled to configure the sense amplifiers for use during a read operation (to read a portion of a wordline of the memory array 594) that is associated with the sense amplifier bitmask 598. The memory array 594 may include one or more types of storage media such as a NAND array or a ReRAM array. For example, the memory array 594 may include or correspond to the memory 104 of FIG. 1 or the memory array 440 of FIG. 4. In some embodiments, the memory array 594 may have a 2D configuration. In other embodiments, the memory array 594 may have a 3D configuration, as described further with reference to FIGS. 6-7.

In a particular embodiment, the controller component 504 includes host interface circuitry 510 coupled to a bus controller 520, such as a direct memory access (DMA) bus controller. The controller component 504 also includes storage interface circuitry 540 that is coupled to the bus controller 520. For example, the host interface circuitry 510 may include or correspond to the host interface 108 of FIG. 1 or the interface circuitry 410 of FIG. 4.

In a particular embodiment, the host interface circuitry 510 includes bus connectors 512 coupled to input/output (I/O) buffers and latches 514. The bus connectors 512 are further coupled to output driver circuitry 516. The host interface circuitry 510 also includes a controller 518. In a particular embodiment, the host interface circuitry 510 operates in accordance with a universal serial bus (USB) protocol. For example, the controller 518 may be programmed to receive USB protocol instructions and data from a host device (not shown) via the bus connectors 512 that are coupled to a universal serial bus. The controller 518 may include a hardware processor that executes instructions stored at an internal memory, such as a read-only memory (not shown) to enable receipt and acknowledgment of USB instructions and data. Alternatively, or in addition, the host interface circuitry 510 may be configured to support other communication protocols, such as a Secure Digital (SD) protocol, a small computer system interface (SCSI), parallel interface (SPI), a Compact Flash (CF) protocol, one or more other protocols, or any combination thereof.

The controller component 504 may include a processor core 530, a random access memory (RAM) 522, and a read-only memory (ROM) 524. The processor core 530, the RAM 522, and the ROM 524 may be coupled to the bus controller 520 via an internal bus 521. In a particular embodiment, the processor core 530 includes an instruction cache 532, a load/store unit 534, an arithmetic logic unit (ALU) unit 536, and a register file 538. The processor core 530 may include, or may function substantially similarly to, an ARM core, as an illustrative, non-limiting example. For example, the processor core 530 may support a reduced instruction set computer (RISC) micro-architecture. The processor core 530 may be configured to retrieve data and executable instructions 526 via the load/store unit 534 from the read only memory 524.

The executable instructions 526 may include one or more instructions to enable the processor core 530 to generate a bitmask to selectively enable and/or disable one or sense amplifiers included in the storage component 508. For example, the executable instructions 526 may include a sense amplifier bitmask generation instruction 527. The sense amplifier bitmask generation instruction 527 may enable the processor core 530 to generate the sense amplifier bitmask 598. As another example, the executable instructions 526 may include one or more instructions to enable the processor core 530 to translate a logical address to a physical address, instructions to determine a portion of a wordline of the memory array 594 to be read, instructions to determine a first storage element and a last storage element of the wordline that correspond to the portion, instructions to identify a set of sense amplifiers that correspond to the portion based on the first storage element and the last storage element, instructions to generate and send the bitmask 598 to the storage component 508, or a combination thereof.

Alternatively, or in addition, at least some of the executable instructions 526 may not be stored at the ROM 524 and may instead be stored at the memory array 594. The executable instructions 526 may be retrieved from the memory array 594 and stored at the RAM 522. The processor core 530 may be configured to retrieve the executable instructions 526 from the RAM 522 for execution.

The executable instructions 526 may be retrieved by the load/store unit 534 and stored to the instruction cache 532. The executable instructions stored at the instruction cache 532 may be scheduled and provided to one or more execution pipelines, such as an execution pipeline including the ALU unit 536. The ALU unit 536 may include dedicated circuitry to perform arithmetic and logic operations, such as addition and subtraction, AND, NOT, OR, exclusive-OR (XOR), other arithmetic or logic operations, or any combination thereof.

The register file 538 may include multiple memory cells that may provide high speed access to the processor core 530 of data to be used for execution of instructions. One or more memory cells at the register file 538 may be dedicated to store a status indicator. Additional data values, such as values to indicate memory type, memory write status, and write protect status, may also be set during execution of the executable instructions 526 at the processor core 530.

Thus, in a particular embodiment, the processor core 530 may be programmed to perform at least a portion of the method 300 of FIG. 3. For example, the processor core 530 may be programmed to receive a read command to read a portion of a wordline of a memory. The processor core 530 may be programmed to determine a first storage element and a last storage element of the portion to identify a first set of storage elements of the wordline that correspond to the portion. The processor core 530 may be programmed to determine a first set of sense amplifiers and a second set of sense amplifiers of a plurality of sense amplifiers. For example, the first set of sense amplifiers may be coupled to the first set of storage elements and the second set of sense amplifiers may be coupled to one or more storage elements of the wordline excluded by the first set of storage elements. The processor core 530 may be programmed to read data (e.g., initiate a data read operation) from the first set of storage elements by sending control signals (e.g., instructions and/or the bitmask 598) to cause the controller 192 to apply a read voltage to the wordline and provide a sense amplifier enabling signal to each sense amplifier of the first set of sense amplifiers while each sense amplifier of the second set of sense amplifiers is disabled.

The storage interface circuitry 540 may include data bus connectors 542, an output driver 544, input/output buffers and latches 546, and error correcting code (ECC) circuitry 548. The data bus connectors 542 may include electrical connectors to enable electrical signal propagation via the bus 506. The I/O buffers and latches 546 may be configured to store data that is received via the bus controller 520 to be transmitted via the bus 506 using electrical signals at the data bus connectors 542 that are generated by the output driver 544. In addition, or alternatively, the I/O buffers and latches 546 may store data values represented by electrical signals received at the data bus connectors 542 via the data bus 506, such as signals generated by the interface circuitry 590 of the storage component 508.

The error correction circuitry 548 may include dedicated hardware and circuitry configured to perform operations (e.g., error detection operations and/or error correction operations) using data corresponding to the data that are received as a result of a memory read from the storage component 508. The storage interface circuitry 540 may include a flash memory interface, and the error correction circuitry 548 may be compliant with one or more flash error correcting code protocols.

Figure 6:
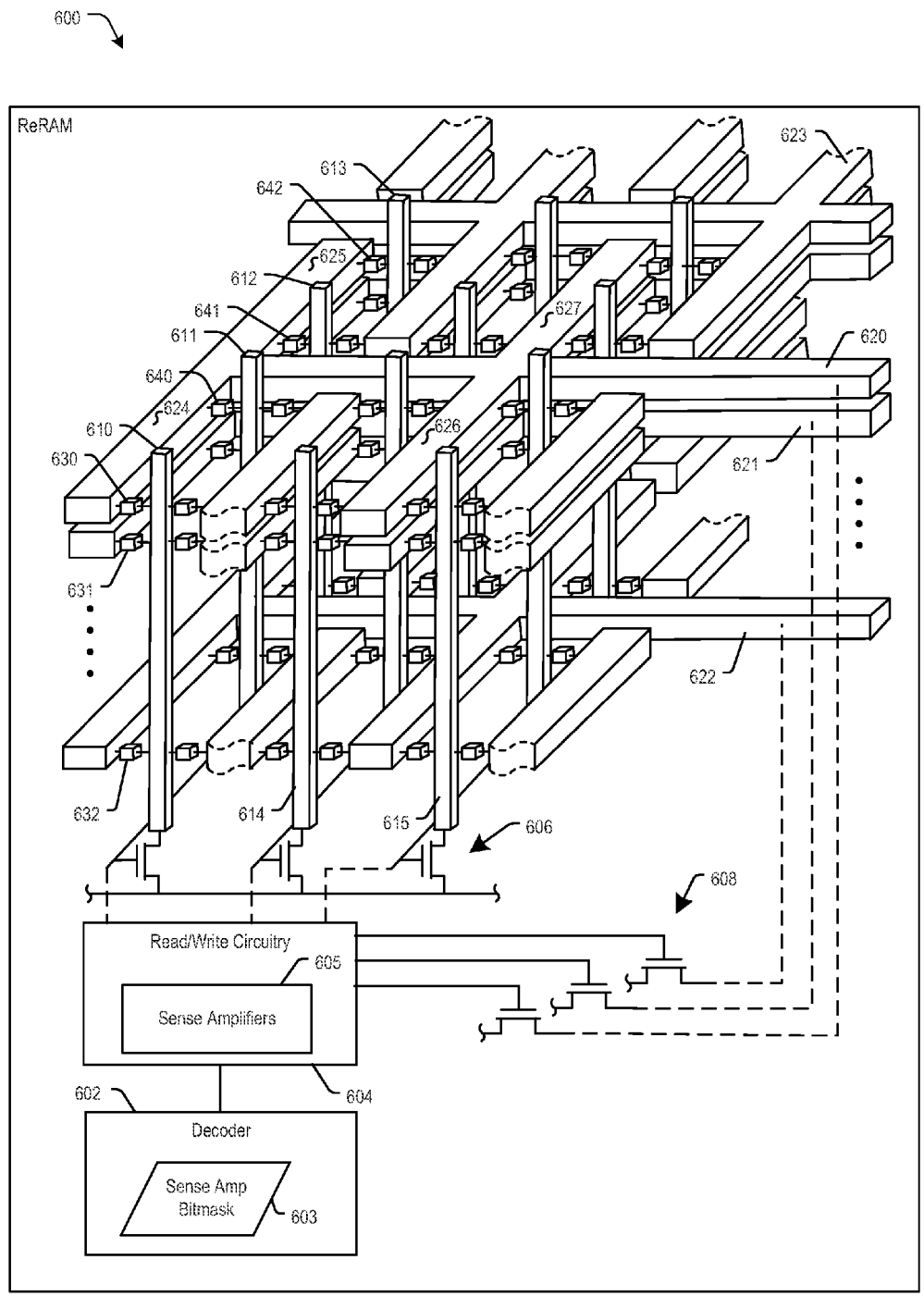
FIG. 6 is a block diagram of a particular embodiment of the memory of the data storage device of FIG. 1, the data storage device of FIG. 4, and/or the data storage device of FIG. 5.

FIG. 6 is a diagram of a particular embodiment of a memory 600. The memory 600 may be included in the data storage device 102 of FIG. 1, the data storage device 402 of FIG. 4, and/or the data storage device 502 of FIG. 5. FIG. 6 illustrates a portion of a three-dimensional architecture of the memory 600, such as a resistive random access memory (ReRAM). For example, the memory 600 may include the memory 104 of FIG. 1, the memory array 440 of FIG. 4, and/or the memory 594 of FIG. 5. In the embodiment illustrated in FIG. 6, the memory 600 (e.g., the ReRAM) includes a plurality of conductive lines in physical layers over a substrate (e.g., substantially parallel to a surface of the substrate), such as representative wordlines 620, 621, 622, and 623 (only a portion of which is shown in FIG. 6) and a plurality of vertical conductive lines through the physical layers, such as representative bit lines 610, 611, 612, and 613.

The memory 600 also includes a plurality of resistance-based storage elements (e.g., memory cells), such as representative storage elements 630, 631, 632, 640, 641, and 642, each of which is coupled to a bit line and a wordline in arrays of memory cells in multiple physical layers over the substrate (e.g., a silicon substrate). The memory 600 also includes read/write circuitry 604, such as the read circuitry 140 of FIG. 1, the write circuitry 142 of FIG. 1, the circuit 200 of FIG. 2, one or more components of the storage component 408 of FIG. 4, or a combination thereof. The read/write circuitry 604 is coupled to wordline drivers 608 and bit line drivers 606. The read/write circuitry 604 may also be coupled to sense amplifiers (not shown) that are coupled to bit lines and configured to sense current in the bit lines during a read operation. The memory also includes the decoder 602. The decoder 602 may include or correspond to the decoder 145 of FIG. 1 or the decoder circuit 439 (e.g., the sense amplifier enable/disable circuit 491) of FIG. 4. The decoder 602 may be configured to generate a sense amplifier bitmask 603, such as the bitmask 160 of FIG. 1 or the sense amplifier bitmask 598 of FIG. 5. The sense amplifier bitmask 603 may enable one or more sense amplifiers 605 of the memory 600 to be configured (e.g., selectively enabled and/or selectively disabled) is association with a read operation to read a portion of a wordline of the memory 600.

In the embodiment illustrated in FIG. 6, each of the wordlines includes a plurality of fingers (e.g., a first wordline 620 includes fingers 624, 625, 626, and 627). Each finger may be coupled to more than one bit line. To illustrate, a first finger 624 of the first wordline 620 is coupled to a first bit line 610 via a first storage element 630 at a first end of the first finger 624 and is coupled to a second bit line 611 via a second storage element 640 at a second end of the first finger 624.

In the embodiment illustrated in FIG. 6, each bit line may be coupled to more than one wordline. To illustrate, the first bit line 610 is coupled to the first wordline 620 via the first storage element 630 and is coupled to a third wordline 622 via a third storage element 632.

During a write operation, the controller 120 may generate data (e.g., control data) or may receive data (e.g., user data) from a host device, such as the host device 130 of FIG. 1. The controller 120 may send the data (or a representation of the data) to the memory 600. For example, the controller 120 may encode the data prior to sending the encoded data to the memory 600.

The read/write circuitry 604 may write the data to storage elements corresponding to the destination of the data. For example, the read/write circuitry 604 may apply selection signals to selection control lines coupled to the wordline drivers 608 and the bit line drivers 606 to cause a write voltage to be applied across a selected storage element. For example, to select the first storage element 630, the read/write circuitry 604 may activate the wordline drivers 608 and the bit line drivers 606 to drive a programming current (also referred to as a write current) through the first storage element 630. To illustrate, a first write current may be used to write a first logical value (e.g., a value corresponding to a high-resistance state) to the first storage element 630, and a second write current may be used to write a second logical value (e.g., a value corresponding to a low-resistance state) to the first storage element 630. The programming current may be applied by generating a programming voltage across the first storage element 630 by applying a first voltage to the first bit line 610 and to wordlines other than the first wordline 620 and applying a second voltage to the first wordline 620. In a particular embodiment, the first voltage is applied to other bit lines (e.g., the bit lines 614, 615) to reduce leakage current in the memory 600.

Additionally, the controller 120 may access the data stored at the memory 600. The controller 120 may cause the read/write circuitry 604 to read bits from particular storage elements of the memory 600 by applying selection signals to selection control lines coupled to the wordline drivers 607 and the bit line drivers 606 to cause a read voltage to be applied across a selected storage element. For example, to select the first storage element 630, the read/write circuitry 604 may activate the wordline drivers 608 and the bit line drivers 606 to apply a first voltage (e.g., 0.7 volts (V)) to the first bit line 610 and to wordlines other than the first wordline 620. A lower voltage (e.g., 0 V) may be applied to the first wordline 620. Thus, a read voltage is applied across the first storage element 630, and a read current corresponding to the read voltage may be detected at a sense amplifier associated with the read/write circuitry 604. The read current corresponds (via Ohm's law) to a resistance state of the first storage element 630, which corresponds to a logical value stored at the first storage element 630. The logical value read from the first storage element 630 and other elements read during the read operation may be provided to the controller 120.

Alternatively, a write operation and/or a read operation of the memory 600 may be initiated by the controller 412 of FIG. 4 and/or the processor core 530 of FIG. 5. A logical value read from the memory 600 may be provided to controller, such as the controller 120 of FIG. 1, the controller component 404 of FIG. 4, or the controller component 504 of FIG. 5.

Figure 7:
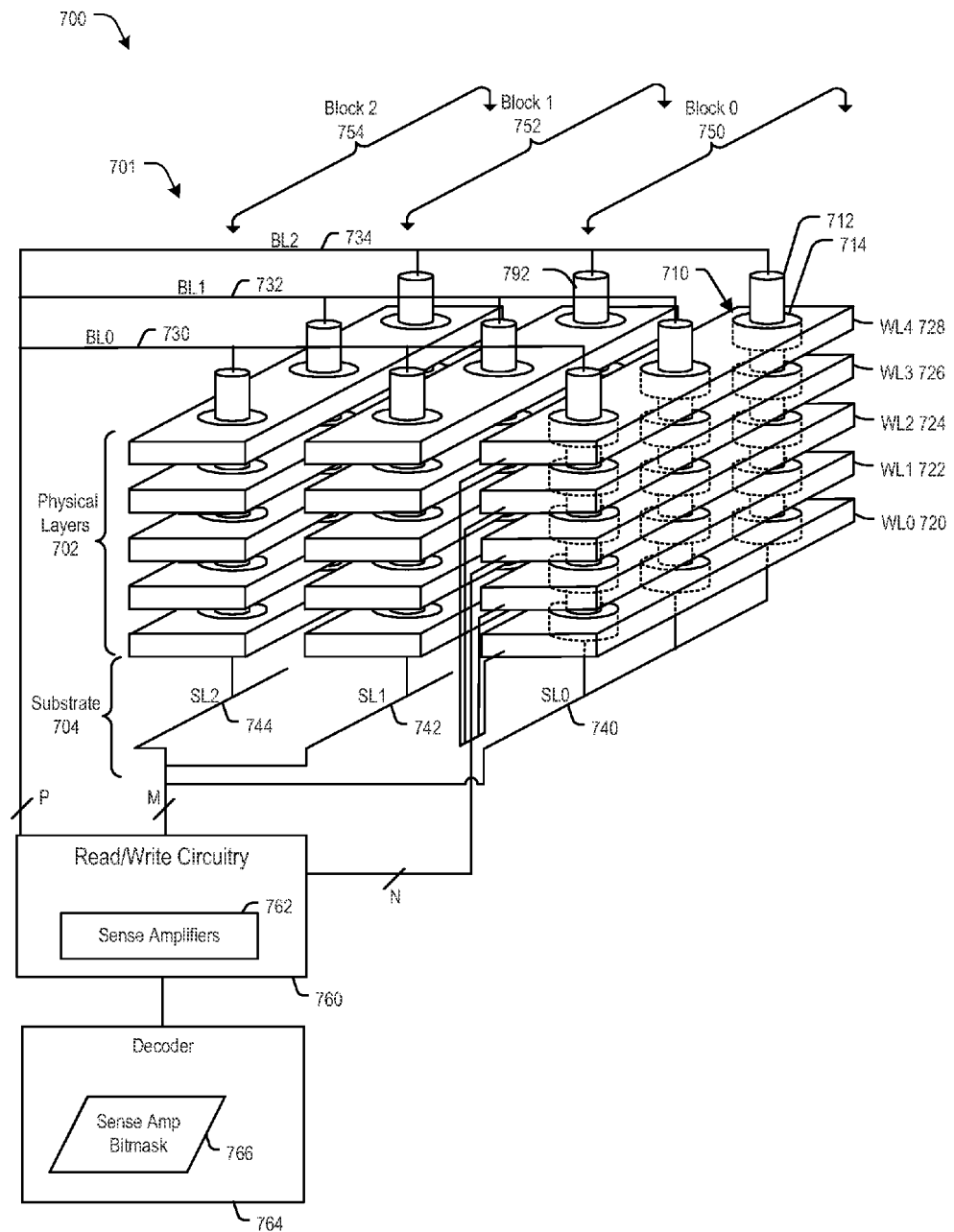
FIG. 7 is a block diagram of another particular embodiment of memory of the data storage device of FIG. 1, the data storage device of FIG. 4, and/or the data storage device of FIG. 5.

FIG. 7 illustrates an embodiment of a memory device 700. The memory device 700 may include or correspond to the data storage device 102 of FIG. 1, the data storage device 402 of FIG. 4, and/or the data storage device 502 of FIG. 5.

The memory device 700 may include a memory 701 having a 3D NAND flash configuration. The memory 701 may include or correspond to the memory 104 of FIG. 1, the memory array 440 of FIG. 4, and/or the memory array 594 of FIG. 5. The memory device 700 may also include read/write circuitry 760 and a decoder 764. The read write circuitry 760 may include or correspond to the read circuitry 140, the write circuitry 142, the circuit 200 of FIG. 2, one or more components of the storage component 408 of FIG. 4, or the read/write circuitry 604 of FIG. 6. The decoder 764 may include or correspond to the decoder 145 of FIG. 1, the decoder circuit 439 (e.g., the sense amplifier enable/disable circuit 491) of FIG. 4, or the decoder 602 of FIG. 6. The decoder 764 may be configured to generate a sense amplifier bitmask 766, such as the bitmask 160 of FIG. 1, the sense amplifier bitmask 598 of FIG. 5, or the sense amplifier bitmask 603 of FIG. 6. The sense amplifier bitmask 766 may enable one or more sense amplifiers 762 of the memory 701 to be configured (e.g., selectively enabled and/or selectively disabled) is association with a read operation to read a portion of a wordline of the memory 701.

The memory 701 includes multiple physical layers 702, that are monolithically formed above a substrate 704, such as a silicon substrate. Storage elements (e.g., memory cells), such as a representative memory cell 710, are arranged in arrays in the physical layers 702.

The representative memory cell 710 includes a charge trap structure 714 between a wordline/control gate (WL4) 728 and a conductive channel 712. Charge may be injected into or drained from the charge trap structure 714 via biasing of the conductive channel 712 relative to the wordline 728. For example, the charge trap structure 714 may include silicon nitride and may be separated from the wordline 728 and the conductive channel 712 by a gate dielectric, such as a silicon oxide. An amount of charge in the charge trap structure 714 affects an amount of current through the conductive channel 712 during a read operation of the memory cell 710 and indicates one or more bit values that are stored in the memory cell 710.

The memory 104 includes multiple erase blocks, including a first block (block 0) 750, a second block (block 1) 752, and a third block (block 2) 754. Each block 750-754 includes a "vertical slice" of the physical layers 702 that includes a stack of wordlines, illustrated as a first wordline (WL0) 720, a second wordline (WL1) 722, a third wordline (WL2) 724, a fourth wordline (WL3) 726, and the fifth wordline (WL4) 728. Multiple conductive channels (having a substantially vertical orientation with respect to FIG. 7) extend through the stack of wordlines. Each conductive channel is coupled to a storage element in each wordline 720-728, forming a NAND string of storage elements. FIG. 7 illustrates three blocks 750-754, five wordlines 720-728 in each block, and three conductive channels in each block for clarity of illustration. However, the memory 104 may have more than three blocks, more than five wordlines per block, and more than three conductive channels per block.

The read/write circuitry 760 is coupled to the conductive channels via multiple conductive lines, illustrated as a first bit line (BL0) 730, a second bit line (BL1) 732, and a third bit line (BL2) 734 at a "top" end of the conducive channels (e.g., farther from the substrate 704) and a first source line (SL0) 740, a second source line (SL1) 742, and a third source line (SL2) 744 at a "bottom" end of the conductive channels (e.g., nearer to or within the substrate 704). The read/write circuitry 760 is illustrated as coupled to the bit lines 730-734 via "P" control lines, coupled to the source lines 740-744 via "M" control lines, and coupled to the wordlines 720-728 via "N" control lines. Each of P, M, and N may have a positive integer value based on the specific configuration of the memory 701. In the illustrative example of FIG. 7, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 792 and a particular source line may be coupled to the top of the conductive channel 712. The bottom of the conductive channel 792 may be coupled (e.g., electrically coupled) to the bottom of the conductive channel 712. Accordingly, the conductive channel 792 and the conductive channel 712 may be coupled in series and may be coupled to the particular bit line and the particular source line.

The read/write circuitry 760 may operate as described with respect to the write circuitry 142 of FIG. 1, the circuit 200 of FIG. 2, one or more components of the storage component 408 of FIG. 4, the read/write circuitry 604 of FIG. 6, or a combination thereof. For example, data may be stored to storage elements coupled to the wordline 728 and the read/write circuitry 760 may read bit values from the storage elements. As another example, the read/write circuitry 760 may apply selection signals to control lines coupled to the wordlines 720-728, the bit lines 730-734, and the source lines 740-742 to cause a programming voltage (e.g., a voltage pulse or series of voltage pulses) to be applied across selected storage element(s) of the selected wordline (e.g., the fourth wordline 728).

During a read operation, the controller 120 may receive a request from a host device, such as the host device 130 of FIG. 1. The decoder 764 may generate the sense amplifier bitmask 766 that may be applied to selectively enable/disable sense amplifiers of the memory 701. The controller 120 may cause the read/write circuitry 760 to read bits from particular storage elements of the memory 104 by applying appropriate signals to the control lines to cause storage elements of a selected wordline to be sensed. Accordingly, the memory 104 may be configured to read from and write data to one or more storage elements.

Although various components of the data storage device 102 and the host device 130 of FIG. 1, the data storage device 402 of FIG. 2, the data storage device 502 of FIG. 5, the memory 600 of FIG. 6, and the memory device 700 of FIG. 7, are depicted herein are illustrated as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of method 300 of FIG. 3. In a particular embodiment, the controller 120, the memory die 103 (e.g., the read circuitry 140, the decoder 145) of FIG. 1, the controller 430 of FIG. 4, the processor core 530 of FIG. 5, the decoder 602, the read/write circuitry 604 of FIG. 6, the read/write circuitry 760, and/or the decoder 764 of FIG. 7 includes a processor executing instructions that are stored at a memory, such as a non-volatile memory of the data storage device 102 or the host device 130. Alternatively or additionally, executable instructions that are executed by the processor may be stored at a separate memory location that is not part of the non-volatile memory, such as at a read-only memory (ROM) of the data storage device 102 or the host device 130 of FIG. 1, the data storage device 402 of FIG. 4, or the data storage device 502 of FIG. 5.

In an illustrative example, the processor may execute the instructions to receive a read command to read a portion of a wordline of a memory. The instructions to receive the read command may include instructions to determine a logical address or a logical address range, instructions to determine a physical address or a physical address range, instructions to translate the logical address or the logical address range into a physical address or a physical address range, instructions to determine an amount of data to be read, and/or instructions to initiate a read operation based on the read command, as illustrative, non-limiting examples. The processor may execute instructions to determine a first storage element and a last storage element of the portion to identify a first set of storage elements of the wordline that correspond to the portion.

The instructions to determine the first storage element and the last storage element may include instructions to determine a logical address or a logical address range, instructions to determine a physical address or a physical address range, instructions to translate the logical address or the logical address range into a physical address or a physical address range, instructions to determine an amount of data to be read, instructions to determine the first storage element based on the physical address, and/or instructions to determine the last storage element based on the physical address, the first storage element, and/or an amount of data to be read, as illustrative, non-limiting examples. The processor may execute instructions to determine a first set of sense amplifiers and a second set of sense amplifiers of a plurality of sense amplifiers. For example, the first set of sense amplifiers may be coupled to the first set of storage elements and the second set of sense amplifiers may be coupled to one or more storage elements of the wordline excluded by the first set of storage elements. The instructions to determine the first set of sense amplifiers and the second set of sense amplifiers may include instructions to determine a range of sense amplifiers that correspond to the portion of the wordline to be read, instructions to determine a first sense amplifier the corresponds to the first storage element, instructions to determine another sense amplifier that correspond to the last storage element, and/or instructions to generate a bitmask based on the first set of sense amplifier and/or the second set of sense amplifiers, as illustrative, non-limiting examples. The processor may execute instructions to read data (e.g., initiate a data read operation) from the first set of storage elements by applying a read voltage to the wordline and providing a sense amplifier enabling signal to each sense amplifier of the first set of sense amplifiers while each sense amplifier of the second set of sense amplifiers is disabled. The instructions to read the data may include instructions to initiate a read operation, instructions to generate a sense amplifier enable/disable signal, instructions to apply a sense amplifier bitmask, instructions to apply a read voltage to the wordline, instruction to activate a wordline driver, instructions to activate one or more bit line drivers, instructions to apply a read voltage to the one or more bit lines, instructions to enable the first set of sense amplifiers, and/or instructions to disable the second set of sense amplifiers, as illustrative, non-limiting examples.

Semiconductor memory devices, such as the memory 104 of FIG. 1, the memory array 440 of FIG. 4, the memory array 595, the RAM 522, or the ROM 524 of FIG. 5, the memory 600 of FIG. 6, or the memory 701 of FIG. 7 include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., in a NOR memory array. NAND and NOR memory configurations described have been presented as examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor material, such as silicon.

The memory elements may be arranged in the single memory device level in an ordered array, such as in a plurality of rows and/or columns. However, the memory elements may be arranged in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements arranged on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. To illustrate, each of the memory device levels may have a corresponding substrate thinned or removed before stacking the memory device levels to form memory arrays. Because each of the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In some implementations, the memory 104 of FIG. 1, the memory array 440 of FIG. 4, the memory array 595, the RAM 522, or the ROM 524 of FIG. 5, the memory 600 of FIG. 6, or the memory 701 of FIG. 7 is a non-volatile memory having a three-dimensional (3D) memory configuration that is monolithically formed in one or more physical levels of arrays of memory cells having an active area disposed above a silicon substrate. The active area of a memory cell may be an area of the memory cell that is conductively throttled by a charge trap portion of the memory cell. The data storage device 102 and/or the host device 130 of FIG. 1, the data storage device 402 of FIG. 2, the data storage device 502 of FIG. 2, the memory 600 of FIG. 6, and/or the memory device 700 of FIG. 7 may include circuitry, such as read/write circuitry, as an illustrative, non-limiting example, associated with operation of the memory cells.

Associated circuitry is typically used for operation of the memory elements and for communication with the memory elements. As non-limiting examples, memory devices may have circuitry for controlling and driving memory elements to perform functions such as programming and reading. The associated circuitry may be on the same substrate as the memory elements and/or on a separate substrate. For example, a controller for memory read-write operations may be located on a separate controller chip and/or on the same substrate as the memory elements One of skill in the art will recognize that this disclosure is not limited to the two dimensional and three dimensional structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
in a data storage device including a memory and a controller, performing:
receiving a read command to read a portion of a wordline of the memory;
determining a first storage element and a last storage element of the wordline to identify a set of storage elements of the wordline;
determining a first set of sense amplifiers and a second set of sense amplifiers of a plurality of sense amplifiers coupled to the wordline, wherein the first set of sense amplifiers is coupled to the set of storage elements, and wherein the second set of sense amplifiers is coupled to one or more storage elements of the wordline other than the set of storage elements of the wordline; and
reading data from the set of storage elements by applying a read voltage to the wordline and providing a sense enable signal to each sense amplifier of the first set of sense amplifiers while each sense amplifier of the second set of sense amplifiers is disabled.

2. The method of claim 1, wherein the data is read from the set of storage elements while a sense disable signal is applied to each sense amplifier of the second set of sense amplifiers, and wherein the read command is associated with a logical address.

3. The method of claim 1, further comprising determining a physical address of the memory corresponding to the portion of the wordline and determining an amount of data to be read, wherein the first storage element and the last storage element are determined based on the physical address and the amount of data to be read.

4. The method of claim 3, wherein an address decoder determines the physical address based on a logical address associated with the read command, and wherein the set of storage elements corresponds to the physical address and the amount of data to be read.

5. The method of claim 1, further comprising generating a bitmask, wherein each bit of the bitmask corresponds to a different sense amplifier of the plurality of sense amplifiers, and wherein a value of the bitmask identifies the first set of sense amplifiers to be enabled and the second set of sense amplifiers to be disabled.

6. The method of claim 1, wherein the data stored at the set of storage elements corresponds to a codeword, and wherein the wordline stores data corresponding to multiple codewords.

7. The method of claim 1, wherein the memory is included in a memory die of multiple memory dies, and wherein each memory die of the multiple memory dies includes one or more wordlines and corresponding storage elements.

8. The method of claim 7, wherein each memory die of the multiple memory dies includes a decoder, wherein the decoder of a particular memory die that includes the wordline determines the first set of sense amplifiers that are coupled to the set of storage elements.

9. The method of claim 1, wherein the memory includes a plurality of storage elements arranged in a two-dimensional (2D) configuration.

10. The method of claim 1, wherein the memory includes a plurality of storage elements arranged in a three-dimensional (3D) configuration.

11. The method of claim 1, wherein the memory includes multiple memory dies, wherein the multiple memory dies are coupled in a stacked configuration.

12. The method of claim 1, wherein the memory is a resistive random access memory (ReRAM).

13. The method of claim 1, wherein the memory is a flash memory.

14. The method of claim 1, wherein the memory includes a three-dimensional (3D) memory configuration that is monolithically formed in one or more physical levels of arrays of memory cells having an active area disposed above a silicon substrate, and wherein the data storage device includes circuitry associated with operation of the memory cells.

15. The method of claim 14, wherein the circuitry includes read circuitry and write circuitry.

16. A data storage device comprising:
a memory including a wordline and a plurality of sense amplifiers coupled to the wordline; and
a decoder coupled to the memory, wherein the decoder is configured to, based on a read command to read a portion of the wordline, determine a first storage element and a last storage element of the portion to identify a set of storage elements of the wordline, wherein the decoder is further configured to determine a first set of sense amplifiers and a second set of sense amplifiers of a plurality of sense amplifies, wherein the first set of sense amplifiers is coupled to the set of storage elements, wherein the second set of sense amplifiers is coupled to one or more storage elements of the wordline other than the set of storage elements of the wordline, and wherein, to read data responsive to the read command, a read voltage is applied to the wordline and a sense enable signal is provided to each sense amplifier of the first set of sense amplifiers while each sense amplifier of the second set of sense amplifiers is disabled.

17. The data storage device of claim 16, wherein the decoder and the memory are included in the same memory die.

18. The data storage device of claim 16, further comprising a controller configured to receive the read command from a host device.

19. The data storage device of claim 18, wherein the decoder is included in the controller.

20. The data storage device of claim 16, wherein the decoder is configured to generate a bitmask, wherein each bit of the bitmask corresponds to a different sense amplifier of the plurality of sense amplifiers, and wherein a value of each bit indicates whether a corresponding sense amplifier is to be enabled or disabled.

21. The data storage device of claim 16, wherein the data to be read responsive to the read command corresponds to a codeword, and wherein the wordline stores data corresponding to multiple codewords.

22. The data storage device of claim 16, wherein a particular sense amplifier of the plurality of sense amplifiers is coupled to a particular storage element of the set of storage elements and is configured to receive a read current and to output a read voltage value.

23. The data storage device of claim 22, further comprising:
a digital-to-analog converter configured to generate a reference voltage value; and
a comparator coupled to the particular sense amplifier and to the digital-to-analog converter, wherein the comparator is configured to receive the read voltage value and the reference voltage value and to generate an output value associated with a data value stored at the particular storage element.

24. The data storage device of claim 16, wherein the memory includes a three-dimensional (3D) memory configuration that is monolithically formed in one or more physical levels of arrays of memory cells having an active area disposed above a silicon substrate, and wherein the data storage device includes circuitry associated with operation of the memory cells.

* * * * *